United States Patent
Kosht et al.

(10) Patent No.: US 7,064,692 B1
(45) Date of Patent: Jun. 20, 2006

(54) SOLID-STATE SYNCHRO/RESOLVER CONVERTER

(75) Inventors: Danial L. Kosht, Gaylord, MI (US); Larry J. Terpstra, Central Lake, MI (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/907,084

(22) Filed: Mar. 18, 2005

(51) Int. Cl.
    *H03M 1/48* (2006.01)
(52) U.S. Cl. ...................... 341/116; 341/112
(58) Field of Classification Search ............... 341/116, 341/117, 112, 118, 120, 155
    See application file for complete search history.

(56) References Cited

U.S. PATENT DOCUMENTS

| | | | | |
|---|---|---|---|---|
| 4,375,636 A | * | 3/1983 | Stack et al. ................. | 341/116 |
| 4,935,692 A | * | 6/1990 | Wakasugi .................... | 324/607 |
| 5,034,743 A | * | 7/1991 | Deppe et al. ................ | 341/116 |
| 5,481,451 A | * | 1/1996 | Kuwahara .................... | 363/37 |
| 5,880,947 A | * | 3/1999 | Imanaka et al. .............. | 363/89 |
| 2002/0019710 A1 | * | 2/2002 | Henry et al. .................. | 702/45 |

* cited by examiner

*Primary Examiner*—Rexford Barnie
*Assistant Examiner*—Linh V. Nguyen
(74) *Attorney, Agent, or Firm*—Black Lowe & Graham PLLC

(57) ABSTRACT

Methods and systems for simply and inexpensive converting the signals of solid-state sensors for use by analog systems and indicators. An embodiment of the system receives a DC voltage value from at least one sensor, converts the DC voltage value into one or more analog signals based on a reference AC voltage signal, and performs at least one of outputting or storing the generated analog signals. The conversion is performed digitally then converted to analog or is performed using an analog trigonometric converter.

9 Claims, 3 Drawing Sheets

SOLID-STATE SYNCHRO/RESOLVER CONVERTER

BACKGROUND OF THE INVENTION

Aircraft sensors and associated recording units or cockpit indicators are typically either communicating all digital or analog information. Newer aircraft have solid-state sensor technology with processing systems and indicators that are designed to operate on the output of the solid-state sensors. Because older aircraft have analog sensors, it is becoming increasingly difficult and costly to maintain these older sensors. Thus, it is preferred to replace old sensors with newer, cheaper, and easier to maintain solid-state sensors, such as Micro Electro Mechanical Systems (MEMS) sensors.

The problem with replacing the old style sensors with new solid-state sensors is that the existing systems that connect with the old style sensors still need to receive the data in the same format that was outputted by the old style sensors. One solution is to replace the processing systems and indicators with processing systems and indicators that are compatible with the new sensors. This, of course, is prohibitively expensive.

Another solution is to translate the data that is outputted by the solid-state sensors into a format that is compatible with the existing systems and indicators within the aircraft. Current translators or converters utilize look-up tables or oscillators to create the proper formatted signals for input into the existing systems and indicators. However, these methods are costly and difficult to implement. Traditional methods require memory (for look-up tables) and/or oscillators that lower system reliability and utilize sync signals which can be susceptible to EMI. Implementation using look-up tables also has finite resolutions bounded by their digital size.

Therefore, there exists a need for simply and inexpensively converting the signals of solid-state sensors for use by the existing systems and indicators on an aircraft.

SUMMARY OF THE INVENTION

The present invention provides methods and systems for simply and inexpensively converting the signals of solid-state sensors for use by analog systems and indicators. An embodiment of the system receives a DC voltage value from at least one sensor, converts the DC voltage value into one or more analog signals based on a reference AC voltage signal, and performs at least one of outputting or storing the generated analog signals. The trigonometric conversion is performed either digitally then converted to analog, or is performed using an analog trigonometric converter.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1:
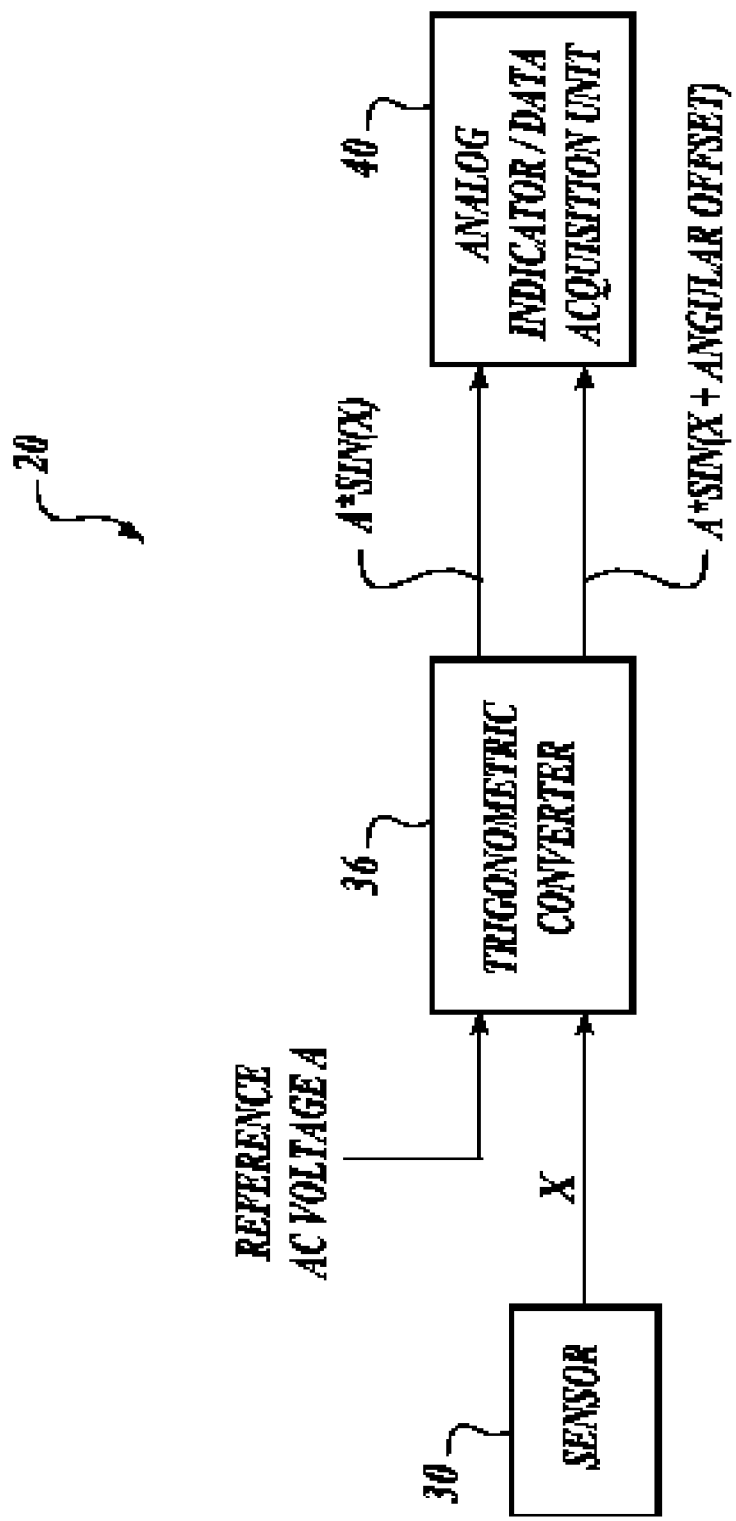
FIGS. 1–3 are block diagrams of various embodiments of the present invention.

FIG. 1 illustrates an example system 20 formed in accordance with an embodiment of the present invention. The system 20 includes a sensor 30, a trigonometric converter 36, and an analog indicator or data acquisition unit 40.

The sensor 30 is a solid-state sensor, such as a MEMS sensor, that outputs a DC voltage signal X based on a sensed condition. The sensor 30 may be any of a number of different types of sensors that are used to sense any number of different type of physical values around the aircraft, such as control surface position, pressure sensors, temperature sensors, etc. The trigonometric converter 36 receives a reference AC voltage signal A and the DC voltage value X from the sensor 30 and converts those into signal formats that are necessary for the analog indicator or data acquisition unit 40. In this example, a first output of the trigonometric converter 36 is the signal A*SIN(X) and a second output is the signal A*SIN(X+angular offset). For a implementation of a resolver, the angular offset would be 90 degrees. More signals may be produced by the trigonometric converter 36 depending upon the requirements (number or type of phase signals) of the analog indicator or data acquisition unit 40.

The analog indicator or data acquisition unit 40 may include any number of analog indicators or gauges, such as those used in an aircraft cockpit. An example data acquisition unit is the processor associated with a flight data recorder.

Figure 2:
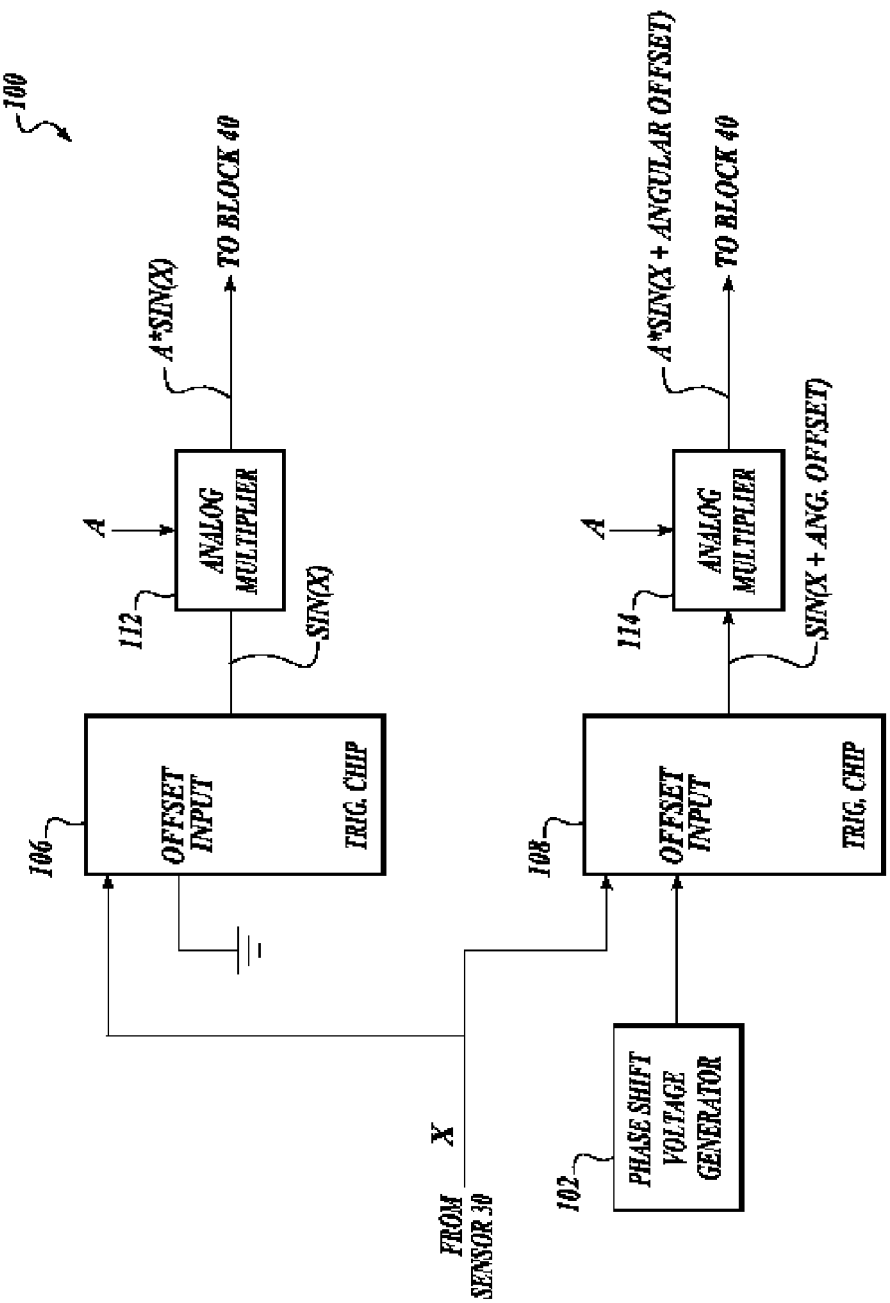

FIG. 2 illustrates a converter 100 that provides the functions of the trigonometric converter 36 shown in FIG. 1 in accordance with a first embodiment. The converter 100 includes a phase shift voltage generator 102, first and second trigonometric chips 106 and 108, and first and second analog multipliers 112 and 114.

In one embodiment, the first and second trigonometric chips 106 and 108 are off-the-shelf trigonometric processing chips, such as the AD639 produced by Analog Devices™. More than two trigonometric chips can be included depending on the desired output or a single chip may be configured to include multiple inputs and outputs for producing desired outputs. The analog multipliers 112 and 114 may also be off-the-shelf devices. In one embodiment, the phase shift voltage generator 102 includes a voltage divider, but could be any of a number of different off-the-shelf voltage generators.

The first and second trigonometric chips 106 and 108 receive the DC voltage value X produced by the sensor 30. An angular offset input pin on the first trigonometric chip 106 is tied to ground, thus providing a zero voltage value at that pin. An angular offset input pin on the second trigonometric chip 108 receives a DC voltage value outputted from the phase shift voltage generator 102. The DC voltage value outputted by the generator 102 depends upon what angular offset is desired. Therefore, the output of the first trigonometric chip 106 is the value SIN (X) and the output of the second trigonometric chip 108 is SIN (X+angular offset). The first analog multiplier 112 receives the reference AC voltage signal A and multiples that with the output of the first trigonometric chip 106 to produce the signal A*SIN(X). The second analog multiplier 114 also receives the reference AC voltage signal A and multiples that to the output of the second trigonometric chip 108, thereby producing the signal A*SIN(X+angular offset). The outputs of the analog multipliers 112 and 114 are sent to the analog indicator or data acquisition unit 40. Amplifiers (not shown) may be used after the multipliers 112 and 114 to amplify the outputted signals and act as a buffer.

Figure 3:
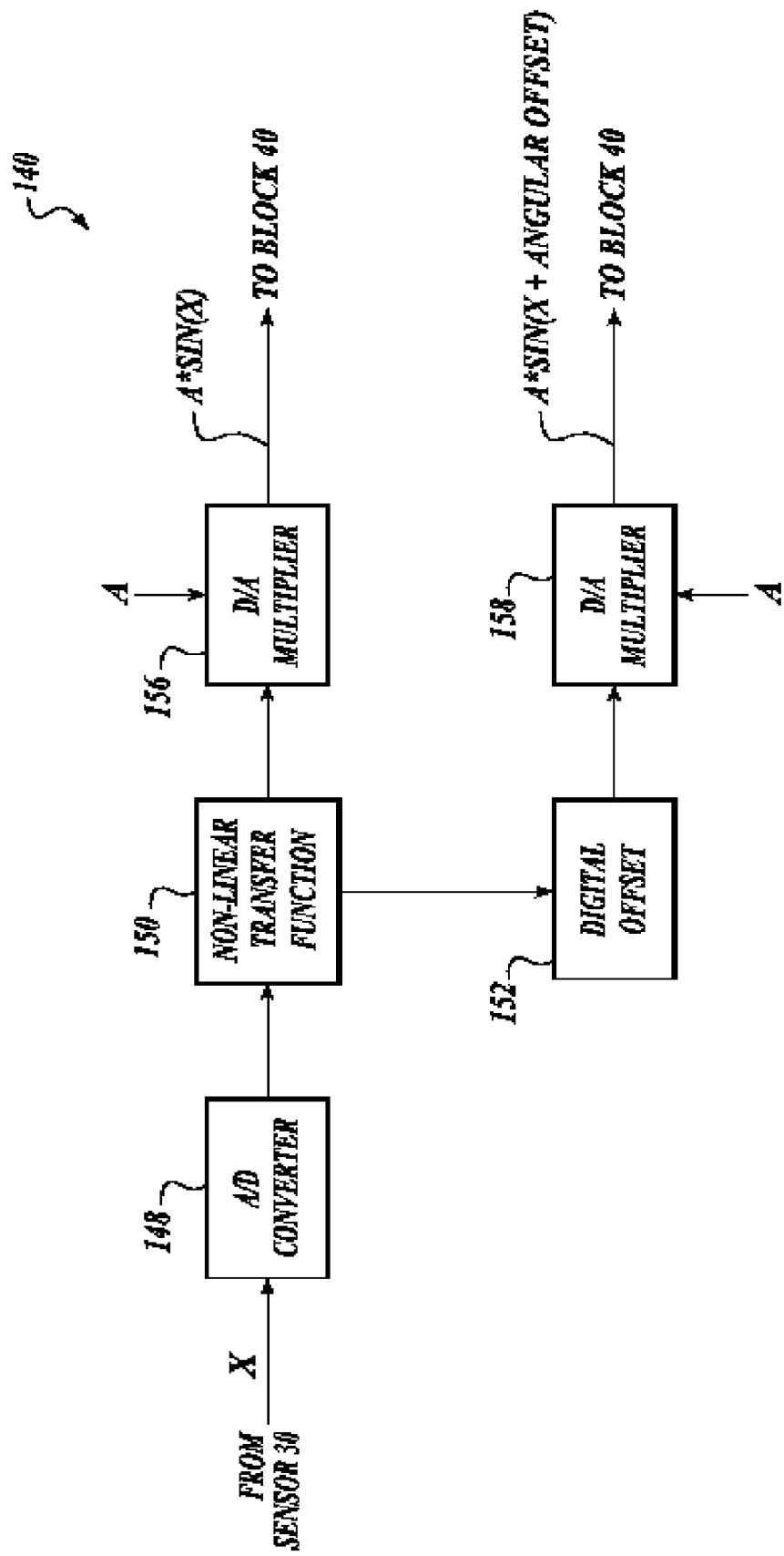

FIG. 3 illustrates a converter 140 that provides the functions of the trigonometric converter 36 shown in FIG. 1 in accordance with a second embodiment. The converter 140 includes an analog to digital (A/D) converter 148, a non-linear transfer function component 150, a digital offset component 152, and first and second multiplying digital to analog (D/A) converters 156 and 158. The components 150 and 152 may be implemented as a field programmable gate array (FPGA) or other functionally comparable device. The A/D converter 148 receives the DC voltage value X from the sensor 30 and converts it into a digital value. The non-linear transfer function component 150 receives the digital output of the A/D converter 148 and converts that linear signal to output a digital representation of a trigonometric signal to the first D/A multiplier 156 and the digital offset component 152. Equation No. 1 is an example of a non-linear transfer function that is utilized by the component 150 to generate the digital sine signal:

$$\text{SIN}(X) \approx \frac{X(1-X^2)(2.83-X^2)}{0.9(1+0.3X^2)} \quad (1)$$

Other types of equations may be utilized to perform the non-linear transfer function at the component 150. The digital offset component 152 performs a digitally implemented pre-defined angular offset based on the desired angular offset that is desired for an output of the converter 140. The first D/A multiplier 156 receives the reference AC voltage signal A and the output of the component 150 to produce the signal A*SIN(X). The second D/A multiplier 158 also receives the reference voltage signal A and combines that with the output of the digital offset component 152 to produce the signal A*SIN(X+angular offset). The output of the multipliers 156 and 158 are sent to the analog indicators or data acquisition unit 40. Amplifiers (not shown) may be used after the multipliers 112 and 114 to amplify the outputted signals and act as a buffer.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A system comprising:
   at least one sensor configured to output a sensor value in the form of a DC voltage value;
   a trigonometric converter for converting the outputted DC voltage value into one or more analog signals based on a reference AC voltage signal; and
   a component configured to perform at least one of outputting or storing the generated one or more analog signals,
   wherein the trigonometric converter comprises:
   an analog to digital converter configured to convert the DC voltage value into a digital value;
   a non-linear transfer function component configured to convert the digital value into a digital trigonometric value using a non-linear transfer function;
   a digital offset component configured to add an offset value to the digital trigonometric value;
   a first multiplier configured to multiply the reference AC voltage signal to the digital trigonometric value; and
   a second digital analog multiplier configured to multiply the reference AC voltage signal to the output of the digital offset component.

2. The system of claim 1, wherein the trigonometric converter includes at least one trigonometric chip.

3. The system of claim 2, wherein at least one trigonometric chip is an AD639 chip.

4. The system of claim 2, wherein the trigonometric converter further includes an analog multiplier for receiving the reference AC voltage signal and combining the reference AC voltage signal with the output of the trigonometric chip.

5. The system of claim 4, wherein the trigonometric converter further includes a phase shift voltage generator for generating an input phase shift voltage value, and wherein at least one of the trigonometric chips outputs a value based on the input phase shift voltage value and the sensor value.

6. The method of claim 4, wherein converting the received DC voltage value into one or more trigonometric values includes generating an input phase shift voltage value and converting the received DC voltage value into one or more trigonometric values is based on the generated input phase shift voltage value.

7. The system of claim 1, wherein the non-linear transfer function is implemented in a field programmable gate array.

8. A method comprising:
   receiving a DC voltage value from at least one sensor;
   converting the DC voltage value into one or more analog signals based on a reference AC voltage signal; and
   performing at least one of outputting or storing the generated analog signals,
   wherein converting further comprises:
   converting the DC voltage value into a digital value;
   converting the digital value into a digital trigonometric value using a non-linear transfer function;
   adding an offset value to the digital trigonometric value;
   multiplying the reference AC voltage signal to the digital trigonometric value; and
   multiplying the reference AC voltage signal to the digital trigonometric value with the added offset value.

9. The method of claim 8, wherein converting further comprises:
   converting the received DC voltage value into one or more trigonometric values;
   receiving a reference AC voltage signal; and
   combining the reference AC voltage signal with the one or more trigonometric values to produce the one or more analog signals.

* * * * *